United States Patent
Kang et al.

(10) Patent No.: US 6,629,880 B1
(45) Date of Patent: Oct. 7, 2003

(54) ROTARY MECHANICAL BUFFING METHOD FOR DEFLASHING OF MOLDED INTEGRATED CIRCUIT PACKAGES

(75) Inventors: Aik Seng Kang, Melaka (MY); Ah Lek Hu, Melaka (MY); Harry Kam Cheng Hong, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 25 days.

(21) Appl. No.: 09/738,953

(22) Filed: Dec. 14, 2000

(51) Int. Cl.[7] .......................... H01L 21/304; B24B 1/00
(52) U.S. Cl. ..................... 451/59; 451/66; 451/109; 15/77
(58) Field of Search .......................... 451/59, 63, 66, 451/177, 178, 182, 313, 319, 108, 109, 172; 15/77, 88.3, 93.1; 438/15, 106; 134/140

(56) References Cited

U.S. PATENT DOCUMENTS

| | | | |
|---|---|---|---|
| 4,993,096 A | * | 2/1991 | D'Amato .................. 15/102 |
| 5,318,677 A | | 6/1994 | Hirbour et al. |
| 5,938,508 A | * | 8/1999 | Canella et al. ................. 451/54 |
| 5,954,566 A | * | 9/1999 | Bauer .......................... 451/254 |
| 6,015,334 A | * | 1/2000 | Hundebol ..................... 451/28 |
| 6,220,943 B1 | * | 4/2001 | Wang et al. ................... 451/59 |
| 6,273,784 B1 | * | 8/2001 | Yamazaki et al. ............. 451/10 |
| 6,336,848 B1 | * | 1/2002 | Sato ............................ 451/66 |
| 6,352,471 B1 | * | 3/2002 | Bange et al. ................ 451/527 |

FOREIGN PATENT DOCUMENTS

| | | | | |
|---|---|---|---|---|
| JP | 58190034 A | * | 11/1983 | ........... H01L/21/56 |
| JP | 59196119 A | * | 11/1984 | ........... B23D/79/00 |

* cited by examiner

*Primary Examiner*—Joseph J. Hail, III
*Assistant Examiner*—David B. Thomas
(74) *Attorney, Agent, or Firm*—Beyer Weaver & Thomas

(57) ABSTRACT

A system comprising a rotary buffing device for removing the mold-flash from leadless leadframe substrate panels is described. The leadless leadframe substrate panels have bottom surfaces that contain electrical contact landing and die attach pad surfaces. Covering at least some of the surfaces of the electrical contact landings and the die attach pads are formations of mold-flash, which are thin layers of molding material. The rotary buffing device is rotated at a sufficiently high rate such that the formations of flash are brushed (or buffed) off the bottom surfaces as the rotary wheel is run along the substrate panels.

26 Claims, 4 Drawing Sheets

ROTARY MECHANICAL BUFFING METHOD FOR DEFLASHING OF MOLDED INTEGRATED CIRCUIT PACKAGES

FIELD OF THE INVENTION

The present invention relates generally to semiconductor device manufacturing, and more specifically to deflashing of packaged semiconductor devices.

BACKGROUND

One method of packaging semiconductor die involves attaching multiple die, or dice, onto leadless leadframe substrate panels that contain arrays of die attach pads. Generally, leadless leadframes include die attach pads that are surrounded by respective sets of electrical contact landings, wherein a die is attached to each of the die attach pads and electrically connected to each of the contact landings within a set. The contact landings provide the physical connection between the input and output terminals of the die and those of a printed circuit board. As with all delicate electronic components, such as integrated circuit chips, molding material is then applied to encapsulate the die and to fix the orientation of the contact landings. See FIG. 1, which illustrates a top plan view of a top surface of a molded leadless leadframe panel 100. The panel 100 includes molding caps 102, which encapsulate the dice that have been placed within each of the leadless leadframe panel. A problem with the process of applying the molding material is that the molding material often coats more than the die and ends up coating part of the contact surfaces of the contact landings and the die attach pads. Such excess resin is referred to herein as "mold-flash" or "flash."

FIG. 2 illustrates a top plan view of a bottom surface of the molded panel 100 having exemplary occurrences of flash. In molded panel 100, molding material has seeped through to the bottom surface of the leadless leadframe panel and has formed thin layers of flash 200. Areas of flash 200 are undesirable, as they are physical obstructions that prevent the strong connections required between singulated semiconductor device packages and printed circuit boards. Flash area 200a, which is formed over contact landings 204, is particularly undesirable as it prevents the electrical connection between the contact landings 204 and the printed circuit board. Therefore, mold-flash must be removed from the bottom surface of leadless leadframe packages during the semiconductor device manufacturing process.

Conventional methods for removing mold-flash include high-pressure impact actions, e.g., wet or dry media honing, and reactive chemical actions, e.g., electrolytic deflashing. Unfortunately, however, these methods have been developed to deflash two-sided leadframe based molded packages. Consequently, these methods are not effective for one-sided leadframe based molded packages, like leadless leadframe packages, because they tend to damage the leadless leadframe panel and they are unable to completely remove the flash. A problem specific to high-pressure impact methods relates to the fact that mechanisms for holding the leadless leadframe panels may not be able to securely hold the panels to withstand the high-pressure conditions. As a result, the panels may drop out of position for deflashing and thereby lead to manufacturing yield losses. Additionally, the conventional methods are generally not cost effective because they involve high operating costs and high equipment investment costs. One factor that increases the operating costs is that the equipment for the conventional methods require large production floor space.

In view of the foregoing, a system and a method for removing mold-flash from leadless leadframe packages without damaging the leadless leadframe panel would be desirable.

SUMMARY

The present invention is directed to a system for removing mold-flash from leadless leadframe substrate panels without damaging the substrate leadframe panel. The system of the present invention uses a rotary buffing device for removing the mold-flash. The leadless leadframe substrate panels have bottom surfaces that contain electrical contact landing and die attach pad surfaces. Covering at least some of the surfaces of the electrical contact landings and the die attach pads are formations of mold-flash, which are thin layers of molding material. The rotary buffing device is rotated at a sufficiently high rate such that the formations of flash are brushed (or buffed) off the bottom surfaces as the rotary device is run along the substrate panels.

In another aspect of the invention, a method for using the system is described.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The present invention pertains to a system that uses a rotary buffing wheel for removing mold-flash from leadless leadframe substrate panels. The leadless leadframe substrate panels have bottom surfaces that contain electrical contact landing and die attach pad (DAP) surfaces. Also covering at least some of the bottom surfaces are formations of mold-flash, which are thin layers of molding material. The rotary buffing wheel is rotated at a sufficiently high rate such that the formations of flash are brushed (or buffed) off the bottom surfaces as the rotary wheel is run along the length of the substrate panels. Advantageously, the rotary buffing wheel is capable of effectively removing the mold-flash formations without causing damage to the substrate panel.

Figure 1:
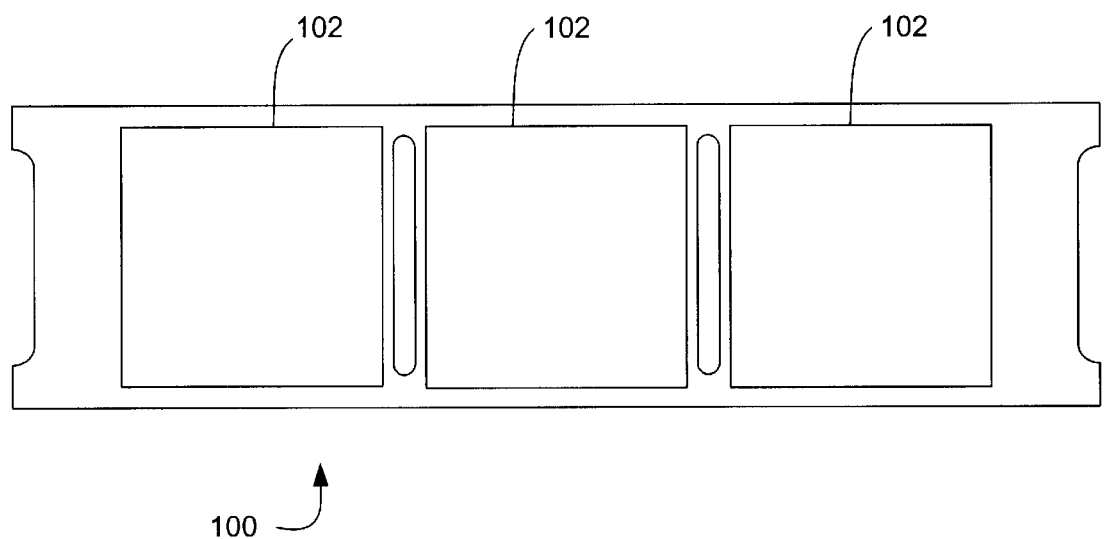
FIG. 1 illustrates a top plan view of a top surface of a molded leadless leadframe panel, as is currently known.
Figure 2:
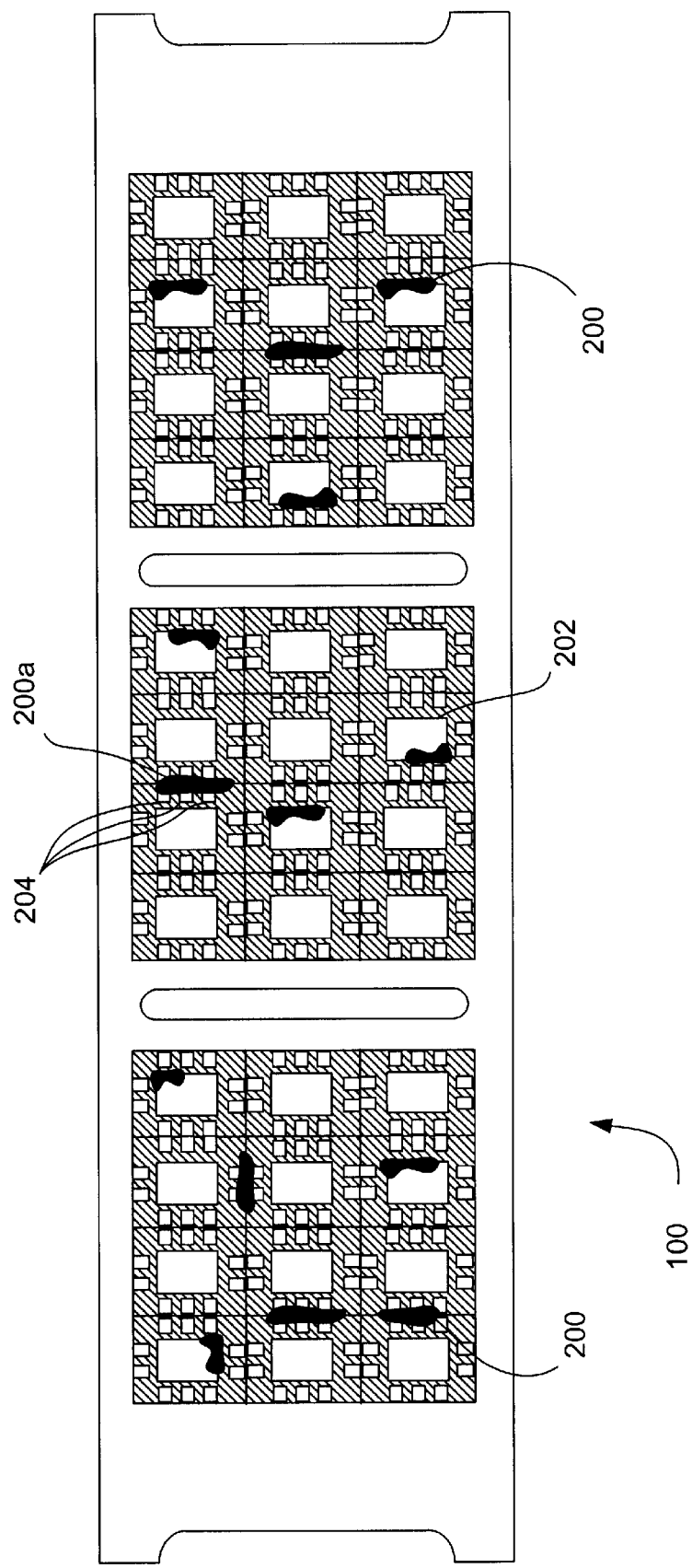
FIG. 2 illustrates a top plan view of a bottom surface of the molded panel of FIG. 1 having exemplary occurrences of flash.
Figure 3:
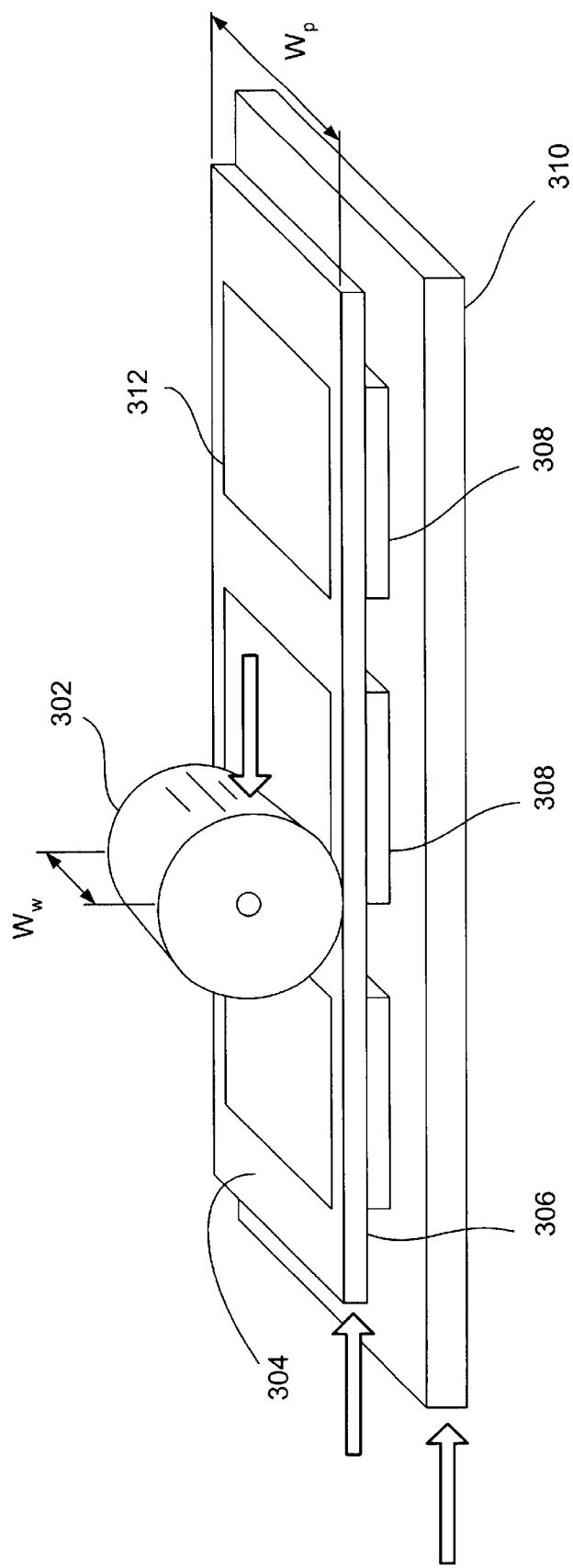
FIG. 3 illustrates a perspective view of a deflashing system, according to one embodiment of the present invention, wherein a rotating buffing wheel is used to remove mold-flash from a bottom surface of a leadless leadframe substrate panel.

Now turning to FIG. 3, a perspective view of one embodiment of a system 300 wherein a rotating buffing wheel 302 is being used to remove mold-flash from a bottom surface 304 of a molded leadless leadframe substrate panel 306. The molding caps 308 of the substrate panel 306 rest upon a conveying device 310 such that the substrate panel 306 is supported beneath the rotary buffing wheel 302. The conveying device 310 moves the panel 306 relative to the buffing wheel 302 so that the buffing wheel 302 may deflash selected areas of the substrate panel 306.

The buffing wheel 302 is a circular wheel brush that is attached to a device (not shown), which causes the wheel 302 to rotate about its axis. The circular wheel brush is generally a wheel-shaped device having bristles extending outwardly from the circumference of the wheel 302. As the buffing wheel 302 rotates, the individual bristles make contact with formations of flash on the bottom surface 304 of the substrate panel 306, thereby brushing off the formations of flash. The length, diameter and stiffness of the bristles can be varied depending upon the degree of abrasive force required by the buffing wheel 302 to remove areas of flash. Stiffer bristles provide a greater degree of abrasiveness and thereby are more capable of removing the formations of flash. Abrasive bristles may be formed of fine grain silicon carbide having specific gravity in the range of 8–9. The advantage of high abrasiveness through stiffer bristles, however, cannot be overexploited as an overly abrasive wheel may cause structural damage to the substrate panel 306. For example, the contact landings and the die attach pads may be damaged due to excessive brushing.

In alternative embodiments, the buffing wheel 302 is a cylinder having an outer surface designed to support a buffing substrate. The buffing substrate may be a tape having a surface appropriate for removing mold-flash. For example, the tape may be similar to commonly known "sand paper." When the buffing substrate becomes less abrasive due to wear, the buffing substrate may be replaced with a new buffing substrate. The buffing substrate may be formed of aluminum oxide, graphite and diamond abrasive. The preferred buffing surfaces are silicon carbide and aluminium oxide.

The process of deflashing the panel 306 requires that the buffing wheel 302 be swept across the leadframe arrays 312 on the bottom surface 304 of the panel 306. The buffing wheel 302 may be swept across the entire bottom surface 304 of the panel 306 along the lengthwise direction or the buffing wheel 302 may be swept in a latitudinal direction across each individual leadframe array 312. The relative movement between the buffing wheel 302 and the panel 306 may be accomplished by moving the buffing wheel 302 across a stationary panel, or by moving the panel relative to a stationary buffing wheel 302, or both the buffing wheel 302 and the panel may be moved relative to each other. In the particular embodiment shown in FIG. 3, a conveying device 310 supports and moves the substrate panel 306 relative to the buffing wheel 302. Conveying device 310 can move the substrate panel 306 in both the latitudinal and longitudinal directions with respect to the length of the substrate panel 306. Of course, alternative and appropriate mechanical devices may be used to move the buffing wheel 302 and/or the substrate panel 306. For example, in one embodiment of the invention, the conveying device 310 may include a speed motor, which turns a leadscrew that is attached to a table, upon which is placed a leadframe panel. In another embodiment of the invention, the conveying device 310 is a servo-motor conveyor belt or chain mechanism.

The rate at which the buffing wheel 302 is rotated depends upon the degree of abrasiveness of the wheel 302, and the rate at which the buffing wheel 302 and the panel 306 are moved with respect to each other. With respect to the abrasiveness of the buffing wheels 302, buffing wheels having a lesser degree of abrasiveness need to be rotated at a higher rate to have a sufficient ability to remove mold-flashes. Otherwise, the lesser abrasive buffing wheels 302 would not be able to completely remove mold-flash formations. On the other hand, buffing wheels have a higher degree of abrasiveness need not be rotated at similarly high rates. Actually, rotating highly abrasive buffing wheels at excessively high speeds may cause excessive removal of material from the bottom surface 304 of the panels 306. For example, material forming the contact landings and die attach pads may be unnecessarily removed. In general, the rotating speed of the buffing wheel may be in the range of approximately 1100 to 4500 revolutions per minute. Preferably, the rotating speed of the buffing wheel is approximately 1500 revolutions per minute.

The rate at which the buffing wheel 302 and the panel 306 are moved with respect to each other affects the rate at which to rotate the buffing wheel 302 because the amount of buffing any one section of the panel 306 receives is directly proportional to the amount of time the buffing wheel 302 is in contact with that section. In other words, a section of the panel 306 will be buffed to a greater degree as the buffing wheel 302 stays in contact with that section a longer amount of time. Therefore, to buff the bottom surface 304 of the panel 306 a sufficient amount, the rate at which the buffing wheel 302 should be rotated should be increased as the speed at which the panel 306 is moved relative to the buffing wheel 302 is increased. In general, the panel 306 may be moved relative to the buffing wheel 302 at a rate between approximately 5–40 mm per second. Preferably, the panel 306 is moved relative to buffing wheel 302 at a rate of approximately 40 mm per second.

Another factor affecting the buffing process of the panel 306 the buffing wheel 302 is the direction in which the buffing wheel 302 is rotated. The buffing wheel 302 may be rotated in two directions, for example, clock-wise and counter clock-wise. In either of the directions, the surface of the buffing wheel 302 that is in contact with the panel 306 ("the buffing surface") may move in the same or opposite direction in which the panel 306 moves with respect to the buffing wheel 302. Preferably, the buffing wheel 302 is rotated in a direction such that the buffing surface of the buffing wheel 302 moves in a direction opposite to the direction in which the panel 306 is moved with respect to the buffing wheel 302. In this manner, the relative speed at which the surface of the buffing wheel 302 buffs the bottom surface of the panel 306 is increased, thereby allowing for more effective buffing. On the other hand, rotating the buffing wheel 302 in a direction such that the buffing surface of the buffing wheel 302 moves in the same direction in which the panel 306 is moved, with respect to the buffing wheel 302, allows for a lighter buffing process.

As seen in FIG. 3, the wheel 302 has a width, $W_w$. The width, $W_w$, may vary according to different embodiments of the invention. In certain embodiments, the width, $W_w$, extends completely across the width of the substrate panel 306, $W_p$. In these embodiments, the wheel 302 buffs the entire bottom surface of the substrate panel 306 after being moved across the panel 306 in one sweeping motion. Of course, the wheel 302 may be swept across the bottom surface 304 multiple times to ensure complete removal of mold-flash. In other embodiments, $W_w$ is smaller than $W_p$ thereby requiring the wheel 302 to be swept across the bottom surface 304 of the panel 306 multiple times so that the entire bottom surface 304 may be buffed section by section. In yet other embodiments of the invention, $W_w$ extends across multiple panel widths $W_p$ such that more than one panel 306 may be buffed simultaneously. Typically, the diameter of the buffing wheel 302 may range from approximately 6–24 inches, while the width of the buffing wheel 302 may range from approximately 1.6–2.5 inches. The preferred diameter of the buffing 302 wheel is approximately 6 inches and the preferred width is approximately 1.8 inches. In one embodiment of the invention, the buffing wheel 302 is made of fine grain silicon carbide material.

Figure 4:
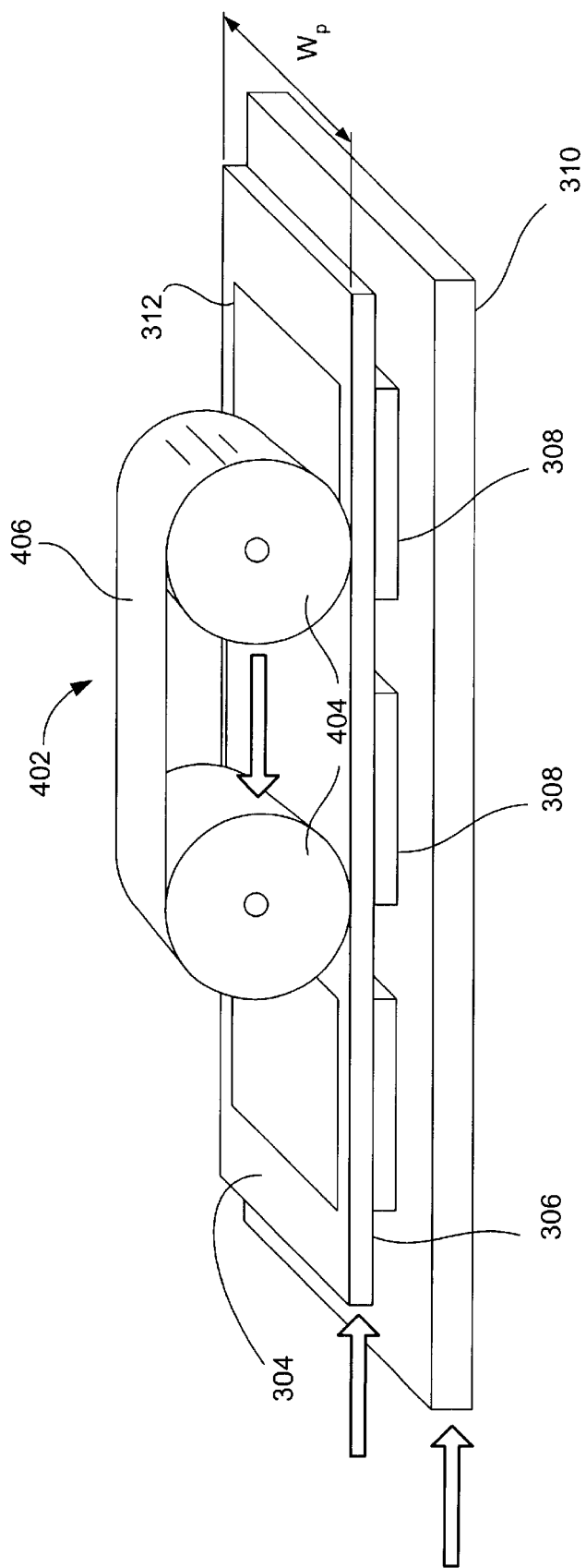
FIG. 4 illustrates a perspective view of a deflashing system, according to one embodiment of the present invention, wherein a buffing belt device is used to remove mold-flash from a bottom surface of a leadless leadframe substrate panel.

In yet another embodiment of the invention, as seen in FIG. 4, a buffing belt device 402 may substitute for the wheel 302. Buffing belt device 402, includes two circular rods 404 that rotate in unison, and a belt 406 that wraps around each of the rods in a way that is analogous to the belt of a conveyor belt system. The outer surface of the belt may contain bristles or it can have a gritty surface as described above. The deflash process can be completed by sweeping the buffing belt device 402 across the substrate panel 306 in a manner similar to which the buffing wheel 302 is utilized. As may be appreciated by those of skill in the art, various rotary buffing devices, in addition to the buffing wheel and the buffing belt device may be used to deflash molded semiconductor devices.

As may be appreciated by those of skill in the art, the buffing wheel 302 may be used to deflash substrates other than molded leadless leadframe substrate panels. For instance, the buffing wheel 302 of the present invention may be used for other types of one-sided leadframe based molded packages.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A deflashing system comprising:
   a leadframe substrate panel having a bottom surface and an opposite facing top surface, wherein a plurality of die attach pad surfaces and a plurality of contact lancing surfaces are exposed through and coplanar with the bottom surface, a formation of mold-flash being formed on at least one of the die attach pad surfaces or the contact landing surfaces;
   a rotary buffing device configured to mechanically buff the bottom surface of the leadframe substrate panel such that the at least one formation of mold-flash is removed without causing damage to the leadframe substrate panel; and
   a conveying device configured to support the leadframe substrate panel such that the leadframe substrate panel is in contact with the rotary buffing device, and wherein the conveying device is configured to move the leadframe substrate panel relative to the rotary buffing wheel.

2. A system for deflashing as recited in claim 1, wherein the leadframe substrate panel is a leadless leadframe substrate panel.

3. A system for deflashing as recited in claim 1, wherein the rotary buffing device is a rotary buffing wheel.

4. A system for deflashing as recited in claim 1, wherein the leadframe substrate panel contains an array of semiconductor device packages, wherein the leadframe substrate panel has a panel width and wherein the rotary buffing device has a buffing device width that is at least as large as the panel width such that the mold-flash can be removed from an entire semiconductor device panel in one sweeping motion.

5. A system for deflashing as recited in claim 3, wherein the rotary buffing wheel has a wheel diameter in the range of approximately 6 to 24 inches, and a wheel width in the range of approximately 1.6 to 2.5 inches.

6. A system for deflashing as recited in claim 5, wherein the rotary buffing wheel has a wheel diameter of approximately 6 inches, and a wheel width of approximately 1.8 inches.

7. A system for deflashing as recited in claim 3, wherein the rotary buffing wheel is formed of fine grain silicon carbide.

8. A system for deflashing as recited in claim 3, wherein the rotary buffing wheel is a wheel brush.

9. A system for deflashing as recited in claim 8, wherein the wheel brush includes bristles formed of fine grain silicon carbide having specific gravity in the range of approximately 8–9.

10. A system for deflashing as recited in claim 3, further comprising a removable buffing tape that is secured to an outer surface of the rotary buffing wheel.

11. A system for deflashing as recited in claim 10, wherein the removable buffing tape is formed of a material selected from the group consisting of silicon carbide, aluminum oxide, graphite and diamond.

12. A system for deflashing as recited in claim 1, wherein the rotary buffing device is a buffing belt device.

13. A method for deflashing one-sided leadframe base molded packages comprising:
   providing a leadframe substrate panel having a bottom surface and an opposite facing top surface, wherein a plurality of die attach pad surfaces and a plurality of contact landing surfaces are exposed through and coplanar with the bottom surface, a formation of mold-flash being formed on at least one of the die attach pad surfaces or the contact landing surfaces; and
   buffing the bottom surface of the substrate panel with a rotary buffing device such that the at least one formation of mold-flash is removed without causing damage to the leadframe substrate panel.

14. A method for deflashing as recited in claim 13 further comprising moving the substrate panel relative to the rotary buffing device such that the rotary buffing device runs along an entire length of the substrate panel.

15. A method for deflashing as recited in claim 13 further comprising moving the substrate panel relative to the rotary buffing device such that the rotary buffing device runs along a latitudinal direction with respect to the length of the substrate panel.

16. A method for deflashing as recited in claim 13, wherein the rotary buffing device rotates such that a buffing surface of the rotary buffing device moves in the same direction in which the substrate panel is moved with respect to the rotary buffing device.

17. A method for deflashing as recited in claim 13, wherein the leadframe substrate panel is a leadless leadframe substrate panel.

18. A method for deflashing as recited in claim 13, wherein the rotary buffing device is a rotary buffing wheel.

19. A method for deflashing as recited in claim 13, wherein the rotary buffing device is a buffing belt device.

20. A deflashing system as recited in claim 1 wherein the leadframe substrate panel contains an array of semiconductor device packages, wherein each of the semiconductor device packages have a package width, and wherein the rotary buffing device has a buffing device width that is at least as large as the package width such that the mold-flash can be removed from an entire semiconductor device package in one sweeping motion.

21. A deflashing method as recited in claim 13 wherein the leadframe substrate panel contains an array of semiconductor device packages, wherein each of the semiconductor device packages have a package width, and wherein the rotary buffing device has a buffing device width that is at least as large as the package width, the buffing operation further comprising:

buffering the bottom surface of an entire semiconductor device package with the rotary buffing device in one sweeping motion.

22. A deflashing method as recited in claim 13 wherein the leadframe substrate panel contains an array of semiconductor device packages, wherein the leadframe substrate panel has a panel width and wherein the rotary buffing device has a buffing device width that is at least as large as the panel width, the buffing operation further comprising:

buffering the bottom surface of the entire leadframe substrate panel with the rotary buffing device in one sweeping motion.

23. A deflashing system as recited in claim 1, wherein the plurality of die attach pad surfaces are configured in a two dimensional array and wherein at least one of the plurality of contact landing surfaces is positioned around a corresponding die attach pad surface.

24. A deflashing system as recited in claim 23, wherein the leadframe substrate panel includes a molded panel being formed on the top surface, the molded panel configured to occupy a gap defined by the plurality of die attach pad surfaces and the plurality of contact landing surfaces.

25. A method for deflashing as recited in claim 13, wherein the plurality of die attach pad surfaces are configured in a two dimensional array and wherein at least one of the plurality of contact landing surfaces is positioned around a corresponding die attach pad surface.

26. A method for deflashing as recited in claim 25, wherein the leadframe substrate panel includes a molded panel being formed on the top surface, the molded panel configured to occupy a gap defined by the plurality of die attach pad surfaces and the plurality of contact landing surfaces.

* * * * *